United States Patent [19]
Ardezzone et al.

[11] 4,144,536
[45] Mar. 13, 1979

[54] INKER NETWORK FOR PROBING MACHINE

[75] Inventors: Frank J. Ardezzone, Santa Clara; Arthur P. Verhoeven, Mountain View, both of Calif.

[73] Assignee: Probe-Rite, Inc., Santa Clara, Calif.

[21] Appl. No.: 853,340

[22] Filed: Nov. 21, 1977

[51] Int. Cl.² ............................................. G01D 15/16
[52] U.S. Cl. ............................... 346/33 F; 324/158 P; 346/141
[58] Field of Search ................. 346/33 F, 141, 140 R; 324/158 P, 158 F; 118/8

[56] References Cited
U.S. PATENT DOCUMENTS

| 3,345,567 | 10/1967 | Turner | 324/158 P |
| 3,943,527 | 3/1976 | Hartmann | 346/33 F |

*Primary Examiner*—Joseph W. Hartary
*Attorney, Agent, or Firm*—Schatzel & Hamrick

[57] ABSTRACT

A inker network for use with a tester and a probing machine for marking semiconductor wafers and including a delay circuit for receiving clocking pulses and a first ink command pulse from the tester and for generating a delayed ink command pulse which is delayed an integer number of clock pulses, a direction detector for receiving first and second transport signals from the probing machine and for generating first and second direction signals dependent on the direction the wafer is being transported, and a steering circuit responsive to the delayed pulse in one mode and for generating a double pulse of adjustment width and amplitude on first or second output lines in response to the first and second direction signals, respectively, and in a second mode for generating the double pulse of adjustment width and amplitude on the first or second or both of the output lines in response to the first or second ink command pulse from the tester or both pulses simultaneously, respectively.

11 Claims, 5 Drawing Figures

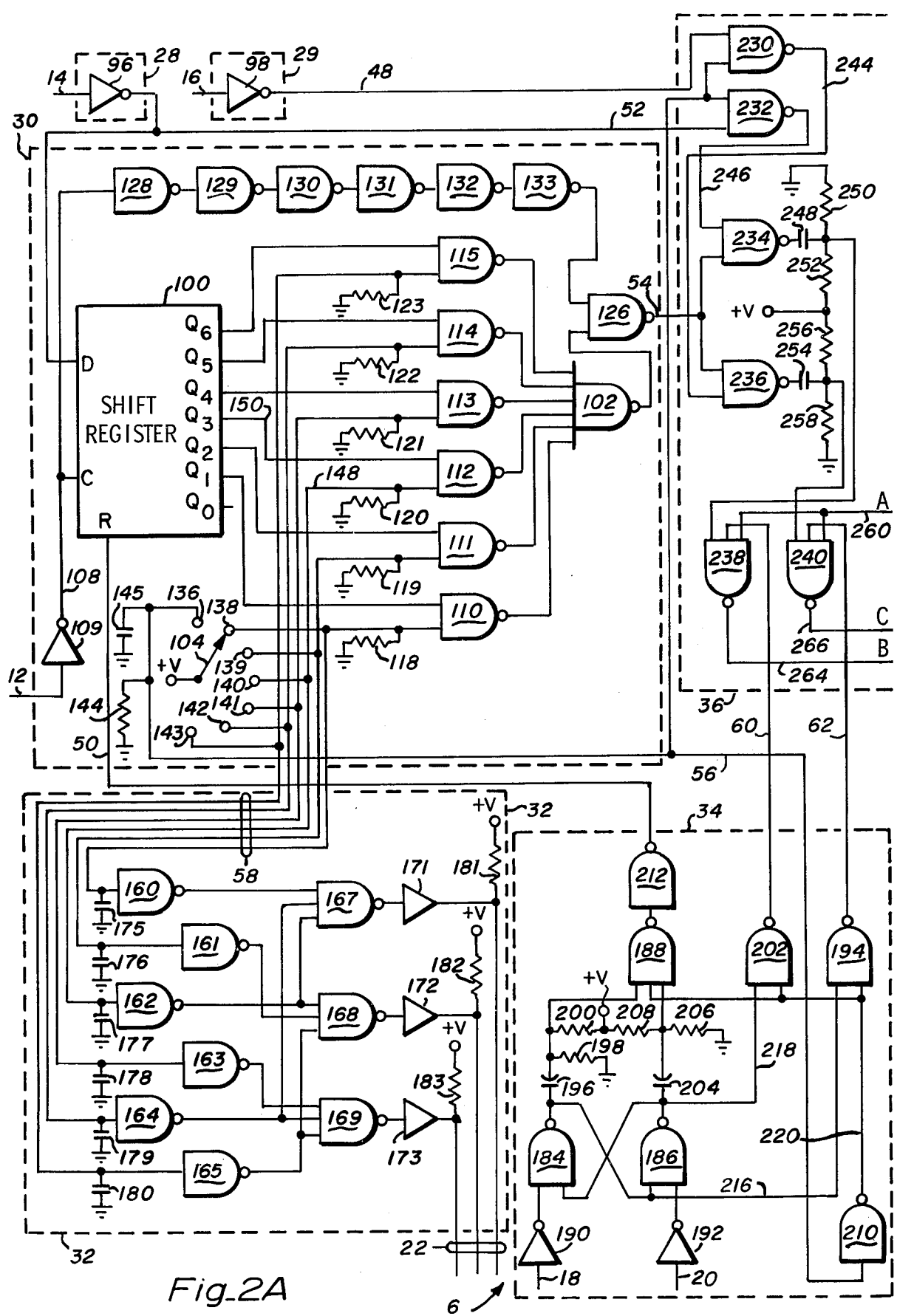
Fig_2A

INKER NETWORK FOR PROBING MACHINE

BACKGROUND OF THE INVENTION

1. Field of the Invention

The present invention relates generally to semiconductor wafer marking devices and more specifically to a double pulse inker network having electronically adjustable parameters for use with a probing machine and a tester.

2. Description of the Prior Art

Integrated circuits are commonly manufactured on thin slices of semiconductor crystal material called wafers. Each wafer contains a large number of autonomous circuits which are later separated, as by scribing and fracturing, into individual chips or dice. Each die is then mounted into an individual package for sale.

Due to a variety of causes, some or all of the dice forming a particular wafer may be found to be defective. In fact, for many integrated circuits, only a small fraction of the total number of dice manufactured might perform satisfactorily. To avoid packaging defective dice, which may significantly contribute to the manufacturing costs, each individual die is usually tested before being divided from the wafer.

Although integrated circuit testing may be partially or fully automated, according to either procedure the wafer is first positioned so as to align a first die under a probe card which is designed to make electrical connections with particular points on the die. Next, the wafer is brought into contact with the probe card and electrical tests are performed by a tester on the individual die. Upon completion of the testing of the first die, the wafer is lowered and moved, as by stepping motors of a probing machine to position a second chip under the probe card. The testing procedure is then repeated on this second die, and so on. Defective dice are marked for later identification.

Numerous methods of marking have been employed such as scratching the die or destroying the die with a charged point or laser beam. Although effective in marking the die, these marking methods are destructive, and if it is later discovered that the testing was not performed satisfactorily, it is not possible to salvage the large number of formerly good dice which have been destroyed. Destructive testing is also incompatible with sorting of the dice by grade.

A more common method of dice marking is by the application of a spot of ink, such as with an inker. Typically, an inker includes a reservoir for the ink, a thin tube or quill which the ink and an ink-directing wick, such as fishline, pass through, and a solenoid and plunger for driving the fishline back and forth in the quill. The solenoid is used to drive the plunger and consequently the fishline down into contact with the die, permitting the ink to flow along the line onto the die. The longer the line is in contact with the die, the larger the dot size. If the line is driven down too far, it will skip along the surface of the die producing a large dot which may extend onto an adjacent die.

Heretofore, manufacturers of testers provided a fixed drive signal to drive their inker. The signal consisted of a pulse of from 5 to 30 milliseconds in width and having an amplitude of from 30 to 90 volts, the parameters having been set by the tester manufacturer. The adjustments provided are mechanical in nature, such as by spring loaded screws to limit the solenoid travel. Such adjustments are usually quite gross and tend to work loose due to vibration caused by the solenoid.

In order to produce a consistent dot size large enough to be easily recognized and small enough not to extend onto adjacent dice, compensation must be made for many variables. Not only are inkers which are produced by different manufacturers used on a given tester, but a large variety of ink types are also employed. Usually, the ink is supplied by the user (the manufacturers of testers seldom supply ink), which may be drafting ink, epoxy ink or some "home brew" such as food coloring and water with perhaps glycerin added for viscosity. The viscosity of the ink also varies because of changes in the ambient temperature.

Another major problem is due to the drying of the ink surface or, skinning, during operation. Should a large number of dice pass the test, and thus not be marked, by the time a defective die is encountered the ink may have skinned, preventing reliable marking. Since the first operation of the inker following skinning usually cleans the inker, subsequent defective dice will be properly marked, thus making detection of the skinning problem more difficult.

SUMMARY OF THE PRESENT INVENTION

It is therefore an object of the present invention to provide a double pulse inker driving signal for more reliable inking.

Another object of the present invention is to provide a means for providing electronically adjustable inker driving signals.

Still another object of the present invention is to provide a means for providing delayed inker driving signals permitting the inkers to be displaced from the test position.

A further object of the present invention is to provide circuitry capable of accepting a broad range of input command signal levels.

Briefly, the preferred embodiment includes a delay circuit for receiving clock pulses and a first ink command pulse from a tester and for generating an ink command pulse which is delayed an integer number of clock pulses, a direction detector for receiving a first and a second transport signal from a probing machine and for generating a first and second direction signal dependent on the direction the wafer is being transported, and a steering circuit responsive to the delayed pulse in one mode and for generating a double pulse of adjustable width and amplitude on first or second output lines in response to the first and second direction signals, respectively, and, in a second mode, for generating the double pulse of adjustable width and amplitude on the first or second or both of the output lines in response to the first or a second ink command pulse from the tester or both pulses simultaneously, respectively.

The inking reliability achieved with the use of a double pulse inker drive signal is therefore a material advantage of the present invention.

Another advantage of the present invention is the ability to accurately compensate for parameter variations.

A further advantage of the present invention is its versatility in accepting a broad range of ink command signal levels.

These and other objects and advantages of the present invention will no doubt become apparent to those of ordinary skill in the art after having read the following detailed description of the preferred embodiment illustrated in the several figures of the drawing.

IN THE DRAWING

DETAILED DESCRIPTION OF THE PREFERRED EMBODIMENT

Figure 1:
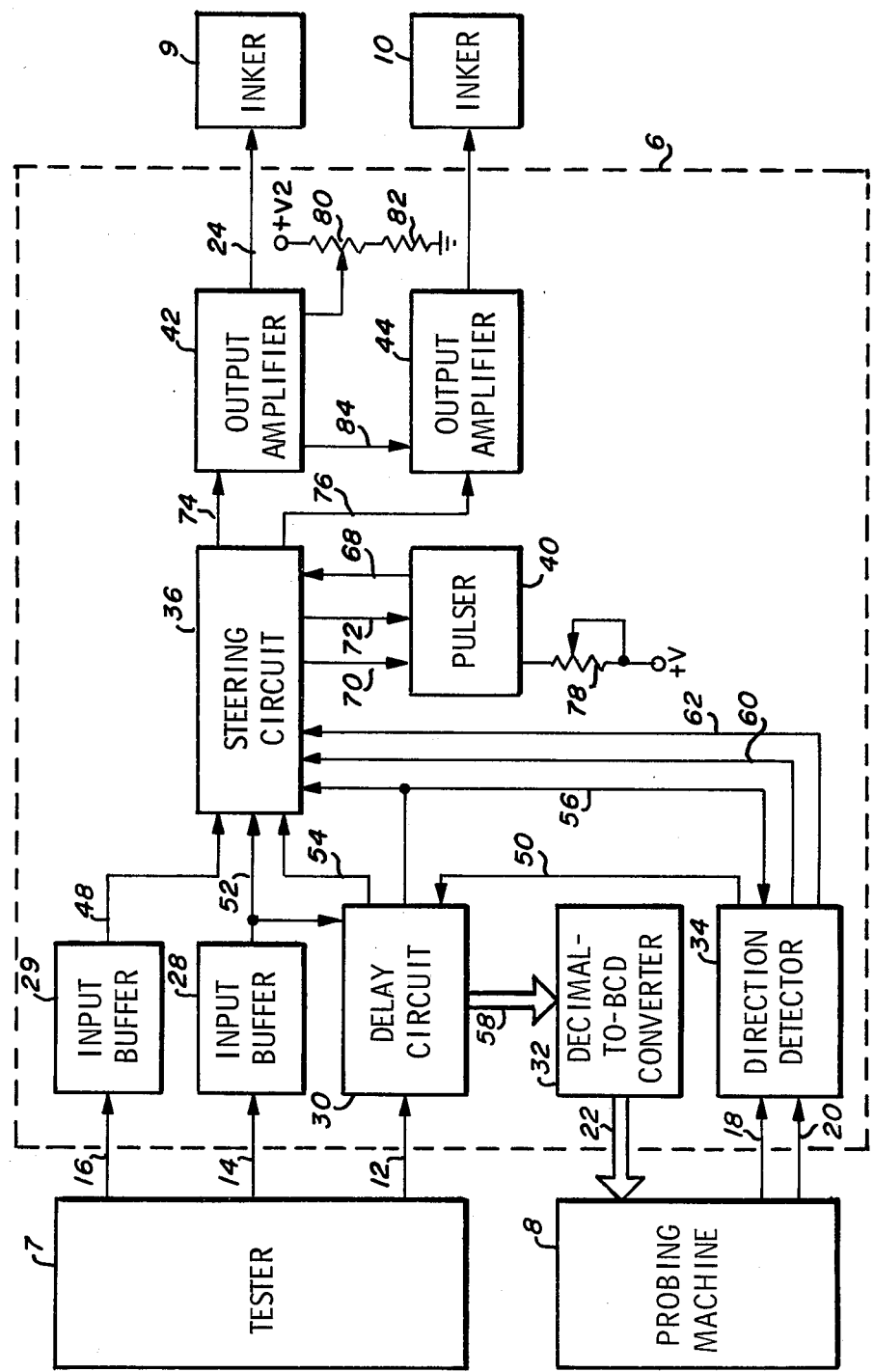
FIG. 1 is a block diagram generally illustrating one embodiment of an inker network for use with a tester and a probing machine in accordance with the present invention.

Referring to FIG. 1, a block diagram is shown generally illustrating the principal components of an inker network for use with a tester and a probing machine in accordance with the present invention. The inker network operates in one of two modes dependent upon the configuration of the probing machine. A first or immediate ink mode is compatible with a machine having one or two inkers which are disposed to allow marking of a die which is in the test position. A second or delayed ink mode is consistent with a machine configuration having first and second inkers located along the test row an integer number of die positions either side of the test position. In this configuration one inker will always lie an integer number of die positions behind the test position, irrespective of whether the machine is proceeding in a first or second direction along a row of dice.

The inker network includes three input lines connected to the tester, line 12, 14, and 16, two lines connected to the probing machine, 18 and 20, an output bus 22, connected to the probing machines, and two output lines 24 and 26 connected to a first and second inker, respectively. Upon the completion of a series of tests performed on a given die, the tester generates a clocking signal on line 12. Coincident with the clocking signal, the tester may be configured to generate ink command signals on lines 14 and 16 indicative of the results of the tests performed. While the wafer is being transported to the right or the left in between tests, the probing machine generates a signal on line 18 or 20.

The inker network generates a signal on bus 22 indicative of the number of die test positions from the current test position to the locations in which the inkers are mounted. The inker network also generates drive signals on lines 24 and 26 for the first and second inkers, respectively.

When the inker network is set in the immediate ink mode, in response to a signal on line 14, the network generates a first inker drive signal on line 24, and in response to a signal on line 16, the inker network generates a second inker drive signal on line 26.

When the inker network is set to the delayed ink mode, it generates on bus 22 a signal indicative of the number of test positions behind the current test position the inkers are positioned. This is necessary in order to cause the probing machine to continue transporting the wafer so that testing occurs past the end of the current row and off of the wafer, to position an inker over the last die position of that row. Upon receipt of the signal on line 14, the inker network generates an inker drive signal on the appropriate one of lines 24 or 26, which is delayed the number of clock pulses required to position the appropriate inker over the die to be marked. Line 24 or 26 is chosen based on whether wafer transport signals were previously generated on line 18 or 20, indicative of the wafer being transported right or left, respectively.

The inker drive signal generated on line 24 or line 26 consists of two pulses, the width of which is adjustable to set the dot size, and the amplitude of which is adjustable to compensate for variations in the viscosity of the ink. A double pulse is generated to provide reliable marking even though a skin may have developed on the ink.

The inker network is comprised of two input buffers 28 and 29, delay circuit 30, a decimal-to-binary-coded decimal (BCD) converter 32, a direction detector 34, a steering circuit 36, a pulser 40 and two amplifiers 42 and 44. Buffers 28 and 29 condition the signals generated on lines 14 and 16 to produce on two lines 52 and 48, respectively, logic level signals of the correct polarity as necessary to interface with the rest of the network.

Delay circuit 30 receives an input from the tester on line 12, an input from buffer 28 on line 52, an input from the direction detector on a line 50 and generates output signals on two lines 54 and 56 and a bus 58. In the immediate ink mode, the delay generates high logic level signals on lines 54, 56 and a first line of bus 58. The delay is unresponsive, in this mode, to signals on lines 12, 50 and 52.

In the delayed ink mode, the delay circuit generates a low logic level signal on line 56 and generates a high logic level signal on a line of bus 58 corresponding to the number of delay steps programmed. When line 50 is high, for each pulse on line 52, the delay circuit generates a negative-going or inverted pulse on line 54, delayed a number of the clock pulses generated on line 12, equivalent to the programmed delay. When the signal level on line 50 is caused to drop to the low logic level subsequent to receipt of an input pulse on line 52 and prior to the generation of the corresponding output pulse on line 54, no corresponding output pulse will be generated.

Decimal-to-BCD converter 32 has inputs connected to bus 58 and generates outputs connected to bus 22. In response to a high signal level on one of the lines of bus 58, corresponding to the programmed delay in decimal format, the converter generates signals on bus 22, corresponding to the binary coded decimal equivalent of that number.

Direction detector 34 has inputs connected to lines 18, 20 and 56, and generates outputs on line 50 and two lines 60 and 62. In the immediate ink mode, the signal level generated on line 56 is at the high logic level. In response to this signal level, the detector generates high logic level signals on lines 60 and 62, and a low logic level signal on line 50.

In the delayed ink mode, the signal level generated on line 56 is low. In this mode, in response to a series of pulses generated on line 18, indicating the probing machine is transporting the wafer from left to right, the detector generates a high level signal on line 60 and a low logic level signal on line 62. In response to a similar series of pulses on line 20, indicating the wafer as being transported from right to left, the detector generates a high logic level signal on line 62 and a low logic level signal on line 60. The detector generates a high logic level signal on line 50 except for an inverted pulse which is generated when pulses previously received on one of lines 18 or 20 are received on the other of the lines, indicative of a reversal in the direction in which the wafer is being transported.

Steering circuit 36 has seven inputs which are connected to lines 48, 52, 54, 56, 60, 62 and 68, and generates outputs on four lines 70, 72, 74 and 76. In the immediate ink mode the signals generated on lines 54, 56, 60 and 62 are all at the high logic level. In this mode, in response to a high logic level pulse generated on line 52, the circuit generates a pulse on line 70 and couples pulses generated on line 68 to line 74. In a similar fashion, upon receipt of a high logic level pulse generated on line 48, the circuit generates a pulse on line 70 and couples the pulses generated on line 68 to line 76.

In the delayed ink mode, the signal level generated on line 56 is at the low logic level and the steering circuit ignores signals generated on lines 48 and 52. In response to an inverted pulse generated on a line 54, the circuit generates a pulse on line 70 and couples the pulses generated on line 68 to line 74 or 76 depending on whether line 60 or line 62 is high, respectively.

The steering circuit also has manual override provisions which are discussed in detail below. In general, in response to the closure of a single cycle switch, in a manual mode, a low signal level is developed on line 72 and pulses generated on line 68 are coupled to both lines 74 and 76. Responsive to the closure of a "Clean" switch, a train of pulses are developed on both lines 74 and 76.

Pulser circuit 40 has a first input connected to line 70, a second input connected to line 72, and a third input connected to one end of potentiometer 78, the wiper and other end of which are connected to the positive logic power supply line, and an ouput connected to line 68. In response to a pulse generated on line 70, or the high to low transition of the signal level developed on line 72, the pulser generates dual pulses on line 68 having a width proportional to the setting of potentiometer 78.

Output amplifier 42 has a first input connected to line 74, a second input connected to the wiper of a potentiometer 80 which is connected between a positive high voltage supply line and a resistor 82, which is connected to ground. The amplifier has a first output connected to line 24 and a second output connected to line 84. In response to pulses generated on line 74, the amplifier generates amplified pulses on line 24 having an amplitude proportional to the setting of potentiometer 80. The amplifier also generates a potential on line 84 proportional to this setting of the potentiometer.

Output amplifier 44 has a first input connected to line 76, a second input connected to line 84 and an output connected to line 26. Responsive to pulses generated on line 76, the amplifier generates amplified pulses on line 26 having an amplitude proportional to the voltage generated on line 84.

Figure 2B:
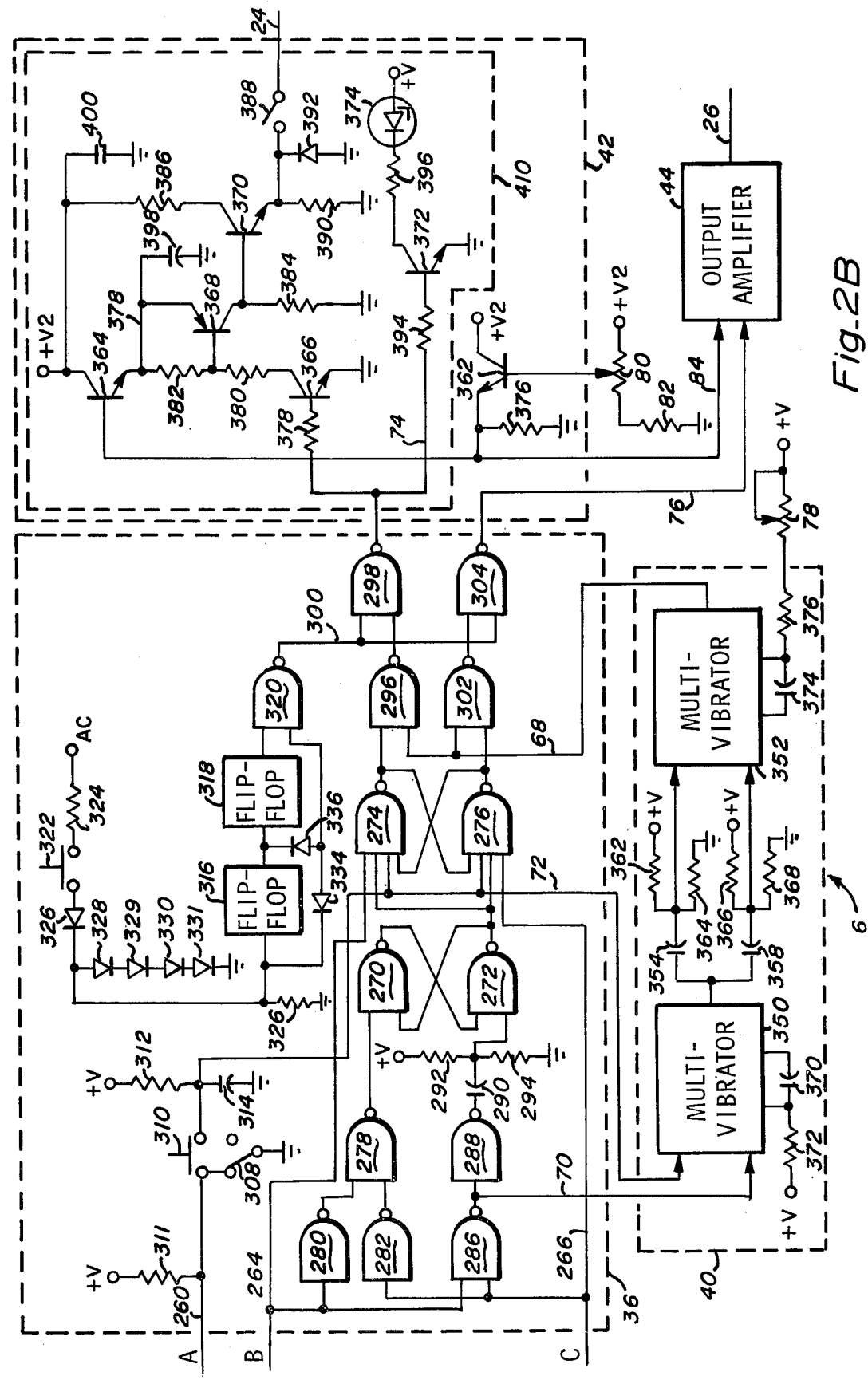
FIG. 2 is a schematic diagram further illustrating the inker network shown in FIG. 1.

Turning now to FIG. 2, a schematic diagram further illustrating the inker network of FIG. 1 is shown. For those applications in which negative-going or inverted pulses are generated on lines 14 and 16, input buffers 28 and 29 include inverters 96 and 98, respectively. The inverters invert the logic level pulses developing normal logic level pulses on lines 48 and 52. The buffers which are discussed in connection with FIG. 3 may also be employed and are required for those applications in which the signal levels generated on lines 14 and 16 are in excess of the normal logic levels.

The principal components of delay circuit 30 include a shift register 100, a gate 102, and a switch 104. Register 100 has a data input connected to line 52, a clock input on a line 108 which is connected to line 12 by an inverter 109 and a reset input connected to line 50. The register has six outputs labeled Q1 through Q6 which are connected to first inputs of six NAND gates, 110 through 115, respectively. The second inputs to gates 110 through 115 are connected to the lines of bus 58 and to circuit ground by pull-down resistors 118 through 123, respectively.

The outputs of gates 110 through 115 each drive one input to NAND gate 102. A NAND gate 126 has a first input connected to the output of gate 102, a second input connected to line 108 by the series connection of six inverting gates 128 through 133, and an output connected to line 54.

Switch 104 has a first or zero delay position 136, and six successively increasing delay positions 138 through 143, for providing circuit delays of from one to six units, respectively. Position 136 is connected to circuit ground by a resistor 144 and a filter capacitor 145 and to line 56. Positions 138 through 143 are connected to the lines of bus 58, and thus, the second inputs to gate 110 through 115, respectively.

When one or two inkers are disposed so as to permit inking of a die which is disposed at the test position, no delay is required. Switch 104 should then be set to position 136, to connect the positive supply potential to line 56. In this position, resistors 118 through 123 maintain the signal levels of the second inputs to gates 110 through 115, near circuit ground potential rendering the gates nonresponsive to signals generated by shift register 100. Gate 102 then generates at its output a low logic level signal causing gate 126 to generate a high logic level signal on line 54.

When the inkers are displaced from the test position, switch 104 should be set to one of positions 138 through 143, corresponding to the appropriate delay. For analysis, assume the inkers are disposed three die positions either side of the test position. Switch 104 should then be set to position 140, which connects the positive supply potential by a line 148 of bus 58 to the second input of gate 112. Further assume that coincident with a clock pulse on line 12, an ink command signal is generated on line 52. In this case, the ink command signal will be clocked into shift register 100. Three clock pulses later, a high logic level signal will be generated at the Q3 output of the register, on a line 150, causing gate 112 to generate on line 152 a low logic level signal. Gate 102 will then generate a high logic level signal at one input to gate 126. The third clock pulse, followed the delay imposed by gates 128 through 133, also clocks the signal through gate 126, causing the generation of an inverted pulse on line 54. A low logic level generated on line 50 when the probing machine reverses direction resets shift register 100.

Decimal-to-BCD converter 32 includes six inverting gates 160 through 165, three 3-input NAND gates 167 through 169 and three amplifiers 171 through 173. The signal generated on the six lines of bus 58 are filtered by six capacitors 175 through 180 and inverted by the inverting gates. The inverted signals are connected to various inputs of the NAND gates, so as to generate at their output the binary-coded-decimal (BCD) equivalent of the decimal signals generated on bus 58. The BCD encoded signals are amplified by the amplifiers which, with three pull-up resistors 181 through 183, produce amplified BCD signals on bus 22.

The principal active components of direction detector 34 include two NAND gates 184 and 186 wired in a latch configuration and a 3-input NAND gate 188. The first input to the latch is connected by an inverter 190 to line 18, and the second input to the latch is connected by an inverter 192 to line 20. The first output of the latch is coupled to a first input of a NAND gate 194 and through a capacitor 196 to the first input of gate 188 which is biased by two resistors 198 and 200 at the high logic level. The second output of the latch is coupled to a first input of a NAND gate 202 and through a capacitor 204, to the second input of NAND gate 188, which is also biased by two resistors 206 and 208 at the high logic level. The second inputs to gates 194 and 202 and the third input to gate 188 are connected by an inverting gate 210 to line 56. The output of gate 188 is connected by an inverting gate 212 to line 50.

In the immediate ink mode, the signal level generated on line 56 is at the high logic level, causing gate 210 to generate a low logic signal level on a line 220. Responsive to this low signal level, gates 194 and 202 generate high logic level signals on lines 62 and 60, and gate 188 causes gate 212 to generate a low logic level signal on line 50, irrespective of signals which are generated by the latch.

In the delayed ink mode, a low logic level signal is present on line 56 causing gates 188, 194 and 202 to be responsive to signals which are generated by the latch. A high logic level signal generated on line 18 by the probing machine, while it is transporting the wafer to the right, sets the latch to a first state, in which a high logic level signal is generated on line 216 and a low signal level is generated on line 218. In this state, gate 202 generates a high logic level signal on line 60 and gate 194 generates a low signal level on line 62. A high logic level signal generated on line 20, when the probing machine is transporting the wafer to the left, sets the latch to the second state causing gate 194 and 202 to generate high and low signal levels, respectively, on line 62 and line 60.

When the latch changes state, an inverted pulse will be coupled to one of the inputs of gate 188 by either capacitor 196 or 204, depending on the previous state of the latch. Responsive to the inverted pulse, gates 188 and 212 generate an inverted pulse on line 50.

An input portion of steering circuit 36 includes first steering gates 230 and 232, second steering gates 234 and 236, and third steering gates 238 and 240. NAND gates 230 and 232 have first inputs connected to line 56, for receiving a mode signal. Gate 230 has a second input connected to line 48, and gate 232 has a second input connected to line 52, both for receiving ink command signals. The outputs of gates 230 and 232 are connected, by two lines 244 and 246, to first inputs of gates 234 and 236, respectively. The second inputs to gates 234 and 236, respectively. The second inputs to gates 234 and 236 are connected to line 54 for receiving delayed ink command pulses. The output of gate 234 is connected by a differentiating capacitor 248 to a first input of gate 238 which is biased by two resistors 250 and 252 to a low logic signal level. The output of gate 236 is coupled in a similar fashion by a capacitor 254 to the first input of gate 240 which is similarly biased by resistors 256 and 258. Gates 238 and 240 have second inputs connected to lines 60 and 62, respectively, third inputs connected to a line 260, and outputs connected to two lines 264 and 266, respectively.

In the immediate ink mode the signal levels generated on lines 54, 56, 60 and 62, are all at the high logic level. In this mode, a pulse generated on line 48 is inverted two times as it is coupled through gate 230 and gate 236. The pulse is differentiated by capacitor 254 and inverted by gate 240 which, for each pulse generated on line 48, generates a narrower constant width inverted pulse on line 266. In a similar fashion, in response to a pulse on line 52, gates 232, 234, capacitor 248 and gate 238 generate on line 264 a narrower constant width inverted pulse.

In the delayed ink mode the low signal level on line 56 causes the gates 230 and 232 to generate on lines 244 and 246, high logic level signals, irrespective of pulses generated on lines 48 and 52. In response to delayed ink command pulses generated on line 54, narrower constant width pulses will be generated on the first inputs to both gates 238 and 240 by gates 234 and 236. The high signal level generated on line 60, while the wafer is being transported to the right, causes gate 238, in response to the narrowed pulses, to generate inverted pulses on line 264. In a similar fashion, when the signal level on line 62 is high, gate 240 will generate inverted narrowed pulses on line 266.

The principal active components of an output portion of steering circuit 36 include two NAND gates 270 and 272 connected in a first latch configuration and two 4-input NAND gates 274 and 276 connected in a modified second latch configuration. A NAND gate 278 has a first input connected to line 264 by an inverting gate 280, and a second input connected to line 266 by an inverting gate 282, so as to generate on line 284, which is connected to a first input to the first latch, an inverted pulse whenever inverted pulses are generated simultaneously on lines 264 and 266. A NAND gate 286 has a first input connected to line 264 and a second input connected to line 266 to generate on line 70 a pulse whenever a pulse is generated on either of lines 264 or 266. Pulses on lines 70 are inverted by a gate 288 and couple by a differentiating capacitor 290, to the second input of the first latch, which is biased at the high logic level by two resistors 292 and 294. The differentiating action of the capacitor and resistors results in substantially narrower pulses being generated at the second input to the first latch than pulses generated by gate 278 at the first input of the latch.

Gate 274 has a first input connected to line 264, and gate 276 has a first input connected to line 266. Gates 274 and 276 have second inputs connected to the output of the first latch and third inputs connected to line 72. A series connection of two gates 296 and 298 generate pulses on line 74 responsive to pulses on line 68 when the signal levels at the first output of the second latch and on a line 300 are at the high logic level. In a similar fashion, a second series connection of two gates 302 and 304 generate pulses on line 76 in response to pulses on line 68 when the signal levels at the second output of the second latch and on line 300 are at the high logic level.

When an inverted pulse is generated only on line 264, an inverted pulse is generated by gate 288, and a high logic level is generated by gate 278. This combination of signals sets the first latch in a first state which generates a high logic level output signal. The inverted pulse on line 264 sets the second latch to a state in which it generates a high logic level at the input to gate 296 and a low logic level at the input to gate 302. Gates 296 and 298 then couple pulses on line 68 to line 74.

An inverted pulse on line 266 similarly sets the first latch to a first state causing the generation of a high logic level output. The inverted pulse on line 266 sets the second latch to a second state in which it generates a low logic level at the input to gate 296 and a high logic level at the input to gate 302. Gate 302 and 304, in response to pulses on line 68, then generate pulses on line 76.

When inverted pulses are generated substantially simultaneously on both lines 264 and 266, both gates 278 and 288 generate inverted pulses. The differentiating action of capacitor 290 causes the pulse at the second input to the first latch to be much shorter than the one generated on line 284. Thus, the pulse generated on line 284 sets the first latch to a second state in which its output is at the low logic level. Until reset, the first latch drives an input to both of gates 274 and 276 with a low logic level signal causing both of the gates to generate outputs which are at the high logic level. This causes gates 296 and 298 and gates 302 and 304 to generate on lines 74 and 76 pulses in response to pulses on line 68.

A manual/auto switch 308 and a single cycle switch 310 allow manual override of the steering circuit. In the manual position, switch 308 connects lines 260 to circuit ground. Closure of switch 310 then also shorts line 72 to circuit ground. In the automatic mode two resistors 311 and 312 maintain the potentials on lines 72 near the positive logic power supply potential. A capacitor 314 with resistor 312 provide switch debouncing for switch 310.

A second manual override circuit includes two flip-flops 316 and 318, and a gate 320. Closure of a "clean" switch 322 couples 60 Hz AC power through a resistor 324 and a rectifier 326 to the input of flip-flop 316. On negative half cycles, the signal level at the input to flip-flop 316 is held at circuit ground potential by a resistor 326, and on positive half cycles, the signal level is clamped at approximately the high logic level by the series connection of four diodes 328 through 331. Flip-flop 316 divides the 60-Hz signal by two to produce a 30-Hz signal which is divided by flip-flop 318 to produce a 15 Hz signal at one input to gate 320. Two diodes 334 and 336, which are connected in an AND configuration, gate the 60-Hz and 30-Hz signals to the second input to gate 320. (Gate 320 and diodes 334 and 336 together operate as a 3-input NAND gate.) When switch 322 is closed, gate 320 generates on line 300 inverted pulses of approximately 8 millisecond width, 15 times a second. These pulses are coupled by gates 298 and 304 to lines 74 and 76.

Pulser circuit 40 includes two monostable multivibrators 350 and 352. Multivibrator 350 has a first input connected to line 72, a second input connected to line 70 and an output coupled by a capacitor 354 to the first input of multivibrator 352 on line 356, and by a capacitor 358 to the second input of multivibrator 352, on line 360. The first input to multivibrator 352 is biased at the low logic level by two resistors 362 and 364, and the second input to multivibrator 352 is biased at the high logic level by two resistors 366 and 368. Multivibrator 350 generates pulses having a width which is set by a capacitor 370 and a resistor 372, constituting the separation between the rising edges of the double pulse output. The pulse width of pulses generated by multivibrator 352 is determined, with potentiometer 78, by a capacitor 374 and resistor 376.

When the signal level on line 72 is at the high logic level, the low-to-high transition, on the leading edge of a pulse generated on line 70, causes multivibrator 350 to generate an output pulse. In a similar fashion when the signal level on line 70 is at the low logic level, a high-to-low transition of the signal on line 72 causes multivibrator 350 to generate an output pulse. A pulse generated by multivibrator 350 is differentiated and coupled by capacitors 354 and 358 to the two inputs of multivibrator 352. In response to the low-to-high transition of this input pulse, multivibrator 352 generates a first output pulses on line 68, and in response to the high-to-low transition of this input pulse the multivibrator generates a second output pulses on line 68. Thus, following an input pulse on line 70, multivibrator 352 generates dual output pulses on line 68 having a width set by potentiometer 78.

Output amplifier 42 includes two transistors 362 and 364 for generating a reference voltage level, three transistors 366, 368 and 370 for providing signal amplification and a transistor 372 and light emitting diode (LED) 374 for providing visual indication of circuit operation. NPN transistor 362 has a collector connected to the high voltage power supply, a base connected to the reference voltage signal developed at the wiper of potentiometer 80, and generates a current-amplified reference voltage at its emitter which is connected to line 84. A resistor 376 is connected from line 84 to circuit ground to provide a path for leakage current flowing in transistor 362. NPN transistor 364 is connected in a Darlington configuration with transistor 362, for generating a further current-amplified voltage reference signal at its emitter, which is connected to line 378.

NPN transistor 366 has an emitter connected to circuit ground and a base counted by a current-limiting resistor 378 to line 74 for receiving the logic level dual pulse signal. The collector of transistor 366 is connected by the series connection of two resistors 380 and 382 to the current-amplified voltage reference signal on line 378 and at their juncture to the base of transistor 368 for generating amplified pulses to saturate transistor 368 in response to the dual pulse signal. The emitter of PNP transistor 368 is connected to line 378 and its collector is connected to the base of NPN transistor 370 for connecting the base of transistor 370 to the reference potential on line 378 when transistor 368 is saturated. The collector of transistor 368 is also connected to circuit ground by a resistor 384 which provides a leakage path for current flowing in transistor 368, holding the base of transistor 370 at circuit ground potential when transistor 368 is off. Transistor 370 is connected as an emitter follower with its collector connected to the high voltage supply by a resistor 386 and its emitter connected to line 24 by a switch 388 for generating output pulses of a level near that of the reference voltage level. A resistor 390 and a diode 392 connected from the emitter of transistor 370 to ground return the potential on line 24 to ground level when the transistor is off and protect the transistor from the reverse current spike generated by the collapsing field of the inker.

Transistor 372 has an emitter connected to circuit ground and a base connected by a current-limiting resistor 394 to line 74 for generating a base current when the dual pulse signal is generated on line 74. The collector of transistor 372 is connected by a current-limiting resistor 396 to a light-emitting diode (LED) for sinking current flowing through the LED in response to a dual pulse input signal to light the LED and thus give visual indication of circuit operation. Two decoupling capacitors 398 and 400 provide a path to ground for spurious noise signals present on line 378 and the high voltage supply line, respectively.

Output amplifier 44 is similar to the portion of output amplifier 42 shown at 410.

Figure 3:
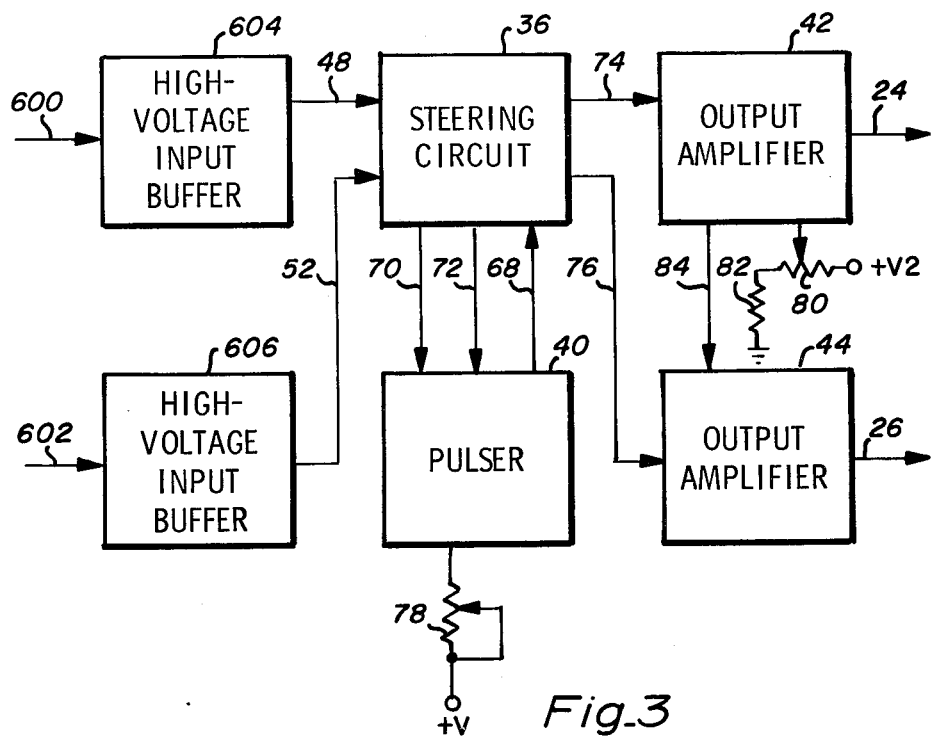
FIG. 3 is a block diagram generally illustrating another embodiment of an inker network in accordance with the present invention.

Referring now to FIG. 3, a block diagram generally illustrating the principal components of an alternative embodiment of an inker network for a tester is shown. The network is designed to permit the retrofitting of existing testers. The network receives on two lines 600 and 602 ink command signals, which previously were used to directly drive first and second inkers. In response to a high voltage ink command signal on line 600 or 602, the network generates a double pulse ink command signal having an adjustable pulse width and amplitude level on line 24 or line 26, respectively. The network includes first and second high voltage input buffer circuits 604 and 606. The network also includes a steering circuit 36, a pulser 40, an output amplifier 42 and an output amplifier 44, similar to those shown in FIG. 1 and described above. Input buffer circuits 604 and 606 receives as inputs ink command signals on line 600 and 602, respectively. The input signal levels may vary from standard TTL logic levels to over a hundred volts, depending on the tester. In response to an input pulse on a line 600, buffer circuit 604 generates a logic level pulse on a line 48. In a similar fashion buffer network 606, responsive to an input pulse on line 602, generates a logic level pulse on line 52.

Steering circuit 36 in response to a pulse generated on line 48 generates a pulse on line 70 causing pulser 40 to generate dual pulses on line 68 having a width which is set by potentiometer 78. The steering circuit couples the dual pulses to line 74. Responsive to the dual pulses on line 74, output amplifier 42 generates amplified high voltage dual pulses on line 24 having an amplitude proportional to the setting of potentiometer 80. In a similar fashion, in response to a high voltage ink command pulse generated on line 602 the network generates dual high voltage ink command pulses on line 26 having a width proportional to the setting of potentiometer 78 and an amplitude proportional to the setting of the potentiometer 80.

Figure 4:
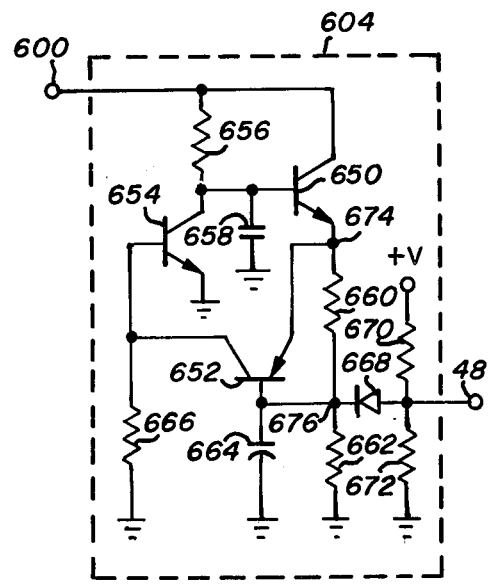
FIG. 4 is a schematic diagram further illustrating one of the high voltage input circuits shown in FIG. 3.

A schematic diagram illustrating the high voltage input buffer circuit 604 is shown in FIG. 4. The circuit includes three transistors 650, 652, 654. NPN transistor 650 has a collector which is connected to line 600, a base connected line 600 by biasing resistor 656 and to circuit ground by a first time constant capacitor 658. The emitter of transistor 640 is connected to the emitter of transistor 652 and to circuit ground by a voltage divider comprised of two resistors 660 and 662. The base of PNP transistor 652 is connected to the juncture of resistors 660 and 662 and to ground by a second time constant capacitor 664. The collector of transistor 652 is connected to circuit ground by a resistor 666 and to the base of NPN transistor 654, which has an emitter connected to circuit ground and a collector connected to the base of transistor 650. A germanium diode 668 is connected from the juncture of resistors 660 and 662 to line 48 which is biased by two resistors 670 and 672.

The values of resistors 660 and 662 are chosen such that when a current flows through resistors 660 and 662 which is sufficient to develop at a node 674 across the voltage divider, a potential substantially that of the high logic level, a potential will be developed across resistor 662, at a node 676, only a few tenths of a volt less than that at node 674. The value of resistor 662 is further chosen with those of resistors 670 and 672 such that absent a current flowing through diode 668, line 48 will be biased at the high logic level, and with a current flowing through diode 668, the potential on line 48 will be that of the low logic level.

When the signal level generated on line 600 is between that of circuit ground and the low logic level, transistors 652 and 654 will be turned off and transistor 650 will not be supplying sufficient current into resistors 660 and 662 to raise the node voltage at 674 to the high logic level. The resulting current flow through diode 668 and resistor 662 causes a low logic level signal to be developed on line 48.

When the signal level generated on line 600 is substantially that of the high logic level, the current flowing through resistor 656 will be sufficiently amplified by transistor 650 to develop (following the time necessary to charge capacitor 658) at node 674, a potential less than that on line 600 by one diode drop plus the few tenths of a volt developed across resistor 656. A voltage of less than one diode drop will be developed across resistor 660 to develop a voltage at node 676 which is sufficient to back-bias diode 668, causing the potential on line 48 to be substantially that of the high logic level. Transistors 652 and 654 will remain turned off.

Should a potential be generated on line 600 substantially greater than the high logic level, the voltage drop across resistor 660 will increase to a level sufficient to bias transistor 652 into the active region. Current flowing through the collector of transistor 652, and resistor 666 will develop a potential across resistor 666 sufficient to also bias transistor 654 into the active region. Transistor 654 will then divert some of the current flowing through resistor 656. The action of transistors 652 and 654 will stabilize the voltage level generated at point 674 at approximately eleven volts, irrespective of the potential generated on line 600. Capacitor 664 provides a short time constant necessary for the transistors to respond to a very fast input pulses. This protects the circuit from damage which might otherwise result from input pulses which have a rise time in excess of that to which the circuit can respond. Capacitor 658 stabilizes the circuit, preventing oscillation.

High voltage input buffer circuit 606 is substantially identical to that of circuit 604, just discussed. It is contemplated that after having read the preceding disclosure certain alterations and modifications of the present invention will no doubt become apparent to those skilled in the art. It is therefore intended that the following claims be interpreted to cover all such alterations and modifications as fall within the true spirit and scope of the invention.

What is claimed is:

1. A testing system for individually testing each circuit on a semiconductor wafer and for marking those circuits which fail the test, comprising:
a tester for testing a circuit on the wafer, said tester being responsive to a first predetermined condition of the tested circuit and operative to generate a first ink command signal;
an inker control network responsive to each said first ink command signal and operative to generate a first inker driving signal having two pulses; and
a first inker responsive to each pulse of said first inker driving signal and operative to mark the tested circuit by depositing a predetermined quantity of ink thereon.

2. A testing system as recited in claim 1 wherein said tester is further responsive to a second predetermined condition of the tested circuit and operative to generate a second ink command signal, wherein said inker control network is further responsive to each second ink command signal and operative to generate a second inker driving signal having two pulses, and wherein said apparatus further comprises a second inker responsive to each pulse of said second inker driving signal and operative to mark the tested circuit by depositing a predetermined quantity of ink thereon.

3. A testing system as recited in claim 1 and further comprising:
   a probing machine for transporting the wafer; said probing machine being operative to generate a first transport signal when said wafer is being transported in a first direction and to generate a second transport signal when said wafer is being transported in a second direction; and
   a second inker responsive to each pulse of a second inker driving signal and operative to mark the tested circuit by depositing a predetermined quantity of ink thereon, and wherein said tester is further operative to generate a series of clocking pulses, and wherein said network is further responsive to said first transport signal, said second transport signal and said series of clocking pulses and is operative to generate said first inker driving signal a preset number of said clocking pulses after the occurrence of said first ink command signal when said first transport signal follows said second transport signal and is operative to generate said second inker driving signal said preset number of said clocking pulses after the occurrence of said first ink command signal when said second transport signal follows said first transport signal, said second inker driving signal having two pulses.

4. A testing system as recited in claim 3 wherein said inker control network includes:
   a delay circuit responsive to each said first ink command signal and said series of clocking pulses and operative to generate a first delayed command signal which is delayed said preset number of said clock pulses;
   a direction detector responsive to said first and second transport signals and operative to generate a first direction signal when said first transport signal follows said second transport signal and operative to generate a second direction signal when said second transport signal follows said first transport signal;
   a pulser responsive to each pulse of a second delayed command signal and operative to generate a third delayed command signal having two pulses;
   a first amplifier responsive to said third delayed command signal and operative to generate said first inker driving signal;
   a second amplifier responsive to said third delayed command signal and operative to generate said second inker driving signal; and
   a steering circuit responsive to said first delayed command signal and operative to generate said second delayed command signal, responsive to said first direction signal and operative to couple said third delayed command signal to said first amplifier, and responsive to said second direction signal and operative to couple said third delayed command signal to said second amplifier.

5. A testing system as recited in claim 4 wherein said pulser includes:
   a first multivibrator responsive to said second delayed command signal and operative to generate a pulse having, a lead edge and a trailing edge;
   a first capacitor having a first end connected to said first multivibrator and a second end;
   a second capacitor having, a first end connected to said first multivibrator and a second end; and
   a second multivibrator having, a first input biased at a first level and connected to said second end of said first capacitor, and a second input biased at a second level and connected to said second end of said second capacitor, whereby said second multivibrator is responsive to said leading edge and operative to generate one pulse of said third delayed command signal and responsive to said trailing edge and operative to generate the other pulse of said third delayed command signal.

6. A testing system as recited in claim 4 wherein said delay circuit includes:
   a shift register having a plurality of register outputs, said shift register for receiving said series of clocking pulses and said first ink command signal and for generating at said register outputs a plurality of output signals each corresponding to said ink command signal delayed a different number of said clocking pulses;
   a switch having a plurality of switch outputs for developing a switch signal on a selected one of said switch outputs;
   a plurality of gates each having a first gate input, a second gate input and a gate output, each of said first gate inputs being connected to a unique one of said register outputs and each of said second gate inputs being connected to a unique one of said switch outputs, whereby said gate receiving said switch signal is operative to develop a gate output signal corresponding to said one of said register outputs connected thereto; and
   a second gate having a plurality of inputs each being connected to a unique one of said first gate outputs, said second gate being responsive to said gate output signal and operative to generate said first delayed command signal.

7. A testing system as recited in claim 1 wherein the inker control network includes:
   a first resistor having:
      a first end connected to circuit ground, and
      a second end;
   a second resistor having:
      a first end connected to said second end of said first resistor, and
      a second end;
   a third resistor having:
      a first end for receiving said first ink command signal, and
      a second end;
   a first transistor having:
      a collector connected to said first end of said third resistor for receiving said first ink command signal,
      an emitter connected to said second end of said second resistor, and
      a base connected to said second end of said third resistor, whereby responsive to a current induced to flow through said third resistor by said first ink command signal, said first transistor is operative to cause an amplified current to flow through said first and second resistors;
a fourth resistor having:
  a first end connected to circuit ground, and
  a second end;
a second transistor having:
  a collector connected to said second end of said fourth resistor,
  a base connected to said second end of said first resistor, and
  an emitter connected to said second end of said second resistor, whereby responsive to said amplified current developing a voltage across said second resistor in excess of a first level, said second transistor is operative to cause a control current to flow through said fourth resistor;
a third transistor having:
  an emitter connected to circuit ground,
  a collector connected to said second end of said third resistor, and
  a base connected to said second end of said fourth resistor, whereby responsive to said control current developing a voltage drop across said fourth resistor in excess of a second level, said third transistor is operative to divert a portion of said induced current causing a fixed amplitude ink command signal to be induced across said first resistor; and
means responsive to said fixed amplitude ink command signal and operative to generate said first inker driving signal.

8. In a testing system including a tester for individually testing each circuit on a semiconductor wafer and when a circuit fails the test for generating a first ink command signal, a first inker for depositing a quantity of ink on the circuit, and a means for connecting the tester to the inker, an improved connecting means comprising:
  a first buffer coupled to the tester, said first buffer for receiving the first ink command signal and for developing a first conditioned command signal;
  a pulser responsive to each pulse of a second conditioned command signal and operative to generate a double pulse signal having two pulses;
  a first amplifier coupled to the first inker, said first amplifier for receiving said double pulse signal and for developing an inner driving signal;
  a steering circuit responsive to said first conditioned command signal and operative to generate said second conditioned command signal and to couple said double pulse signal to said first amplifier.

9. In a testing system as recited in claim 8 wherein the tester further generates a second ink command signal, wherein the system further includes a second inker, and wherein the connecting means further comprises:
  a second buffer coupled to the tester, said second buffer for receiving the second ink command signal and for developing a third conditioned command signal; and
  a second amplifier connected to the second inker, said second amplifier for receiving said double pulse signal and for developing a second inker driving signal, and wherein said steering circuit is further responsive to said third conditioned command signal and operative to generate said second conditioned command signal and to couple said double pulse signal to said second amplifier.

10. In a semiconductor testing apparatus as recited in claim 8 wherein the first buffer comprises:
  a first resistor having:
    a first end connected to circuit ground, and
    a second end connected to said steering circuit;
  a second resistor having:
    a first end connected to said second end of said first resistor, and
    a second end;
  a third resistor having:
    a first end connected to said tester for receiving said first ink command signal, and
    a second end;
  a first transistor having:
    a collector to said first end of said third resistor for receiving said first ink command signal,
    an emitter connected to said second end of said second resistor, and
    a base connected to said second end of said third resistor, whereby responsive to a current induced to flow through said third resistor by said first ink command signal, said first transistor is operative to cause an amplified current to flow through said first and second resistors;
  a fourth resistor having:
    a first end connected to circuit ground, and
    a second end;
  a transistor having:
    a collector connected to said second end of said fourth resistor,
    a base connected to said second end of said first resistor, and
    an emitter connected to said second end of said second resistor whereby responsive to said amplified current developing a voltage drop across said second resistor in excess of a first level, said second transistor is operative to cause a control current to flow through said fourth resistor;
  a third transistor having:
    an emitter connected to circuit ground,
    a collector connected to said second end of said third resistor, and
    a base connected to said second end of said fourth resistor, whereby responsive to said control current developing a voltage drop across said fourth resistor in excess of a second level, said third transistor is operative to divert a portion of said induced current developing said first conditioned command signal across said first resistor.

11. In a testing system as recited in claim 8 wherein the tester further generates a series of clocking pulses, wherein the system further includes a probing machine for transporting the wafer, for generating a first transport signal when the wafer is being transported in a first direction and for generating a second transport signal when the wafer is being transported in a second direction, and a second inker, and wherein the coupling means further comprises:
  a delay circuit connected to the tester, said delay circuit being responsive to said first conditioned command signal and operative to generate a delayed command signal which is delayed a preset number of said clocking pulses;
  a direction detector connected to the probing machine, said detector being responsive to said first and second transport signals and operative to generate a first direction signal when said first transport signal was more recently received than said second transport signal and to generate a second direction signal otherwise;

a second amplifier connected to said second inker, said amplifier for receiving said double pulse signal and for developing a second inker driving signal, and wherein said steering circuit is responsive to said delayed command signal and operative to generate said second conditioned command signal, responsive to said first direction signal and operative to couple said double pulse signal to said first amplifier and responsive to said second direction signal and operative to couple said double pulse signal to said second amplifier.

* * * * *